(12) United States Patent
Klein

(10) Patent No.: US 6,440,230 B1
(45) Date of Patent: Aug. 27, 2002

(54) NITRIDE LAYER FORMING METHOD

(75) Inventor: Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/518,560

(22) Filed: Mar. 3, 2000

(51) Int. Cl.$^7$ ................................................ C23C 8/36
(52) U.S. Cl. ...................... 148/222; 205/220; 205/221; 205/283; 427/533; 438/798
(58) Field of Search ................................ 205/220, 221, 205/191, 283; 438/798; 148/222; 427/533, 569

(56) References Cited

U.S. PATENT DOCUMENTS

| | | | |
|---|---|---|---|
| 5,226,975 A | | 7/1993 | Denton |
| 5,275,715 A | | 1/1994 | Tuttle |
| 5,286,676 A | | 2/1994 | Kruger et al. |
| 5,656,860 A | | 8/1997 | Lee |
| 6,087,730 A | * | 7/2000 | McGarvey et al. ......... 205/220 |
| 6,136,175 A | * | 10/2000 | Steizi et al. ................. 257/766 |
| 6,183,859 B1 | * | 2/2001 | Chen et al. .................. 428/332 |
| 6,224,991 B1 | * | 5/2001 | Yates et al. .................. 428/607 |

FOREIGN PATENT DOCUMENTS

| EP | 58201808 | 10/1983 |
|---|---|---|
| EP | 0421735 A2 | 2/1990 |
| EP | 5287049 | 11/1993 |

OTHER PUBLICATIONS

A. Fayer, et al, "Deposition of Continuous and Well Adhering Diamond Films on Steel", Applied Physics Letter, Americant Institute of Physics, vol. 67, No. 16, Oct. 16, 1995, pp. 2299–2301.
N.V. Parthasaradly, entitled: *"Practical Electroplating Handbook"*; Chapter 5, pp. 186–192.
J. Chuang, S. Tu, M. Chen, entitled "Rapid Thermal Annealed Cr Barrier Against Cu Diffusion"; *Journal of The Electrochemical Society*, 146(7) 2643–2647 (1999). No month available.
J. Chuang, S. Tu, M. Chen, entitled : "Sputtered Cr and Reactively Sputtered CrNX Serving as Barrier Layers Against Copper Diffusion"; *Journal of The Electrochemical Society*: 145 (12) 4290–4296 (1998). No month available.
Jun Takada, Abstract of Japanese article entitled: "Plasma nitriding of iron–chromium alloys," appearing in Funtai oyobi Funmatsu Yakin 39(4), 314–17 (1992). No month available.
D.E. Muller, Abstract of article entitled: "Use of nitrogen–implanted chromium overcoat for improving the durability of thin–film magnetic media," appearing in *J. Mater. Eng. Perform.* 1(4), 489–93 (1992). No month available.
P. Groening, Abstract of article entitled: "Surface modifications of nitrogen–plasma–treated stainless steels," appearing in *Appl. Surf. Sci. 64(3)*, 265–73 (1993). No month available.
A. Molinari, Abstract of article entitled: "Effect of the treatment a time on the characteristics of ion–nitrided iron–chromium sintered alloys," appearing in *Metall. Ital.*, 82(3), 275–81 (1990). No month available.

* cited by examiner

Primary Examiner—Nam Nguyen
Assistant Examiner—Wesley A. Nicolas
(74) Attorney, Agent, or Firm—Wells St. John P.S.

(57) ABSTRACT

Nitride layer formation includes a method where a material is electrodeposited on a substrate and converted, at least in part, to a layer comprising nitrogen and the electrodeposited material. The electrodepositing may occur substantially selective on a conductive portion of the substrate. Also, the converting may comprise exposing the electrodeposited material to a nitrogen-comprising plasma. Chromium nitride and chromium oxynitride are examples of nitrogen-comprising materials. Copper or gold wiring of an integrated circuit are examples of a substrate. The chromium may be converted to a chromium-nitride-comprising diffusion barrier using a nitrogen-comprising plasma.

20 Claims, 1 Drawing Sheet

NITRIDE LAYER FORMING METHOD

TECHNICAL FIELD

This invention relates to nitride layer, including metal nitride layer, forming methods and diffusion barrier forming methods, including diffusion barriers for integrated circuit wiring.

BACKGROUND OF THE INVENTION

Several advantages exist to replacing aluminum with copper as the preferred metallization in semiconductor devices. The higher conductivity of copper allows reduction in the cross-sectional area of conductive components and/or an increase in electric current. However, several disadvantages of copper metallization exist as well. One such disadvantage is that diffusion barriers are more frequently desired to prevent diffusion of copper into surrounding materials. Conventional diffusion barriers for copper metallization are typically formed in an awkward, somewhat inefficient process. Accordingly, a need exists to form diffusion barriers for copper metallization in a simple yet effective manner.

SUMMARY

One aspect of the invention includes a nitride layer forming method wherein a material is electrodeposited on a substrate and converted, at least in part, to a layer comprising nitrogen and the electrodeposited material. By way of example, the electrodepositing may occur substantially selective on a conductive portion of the substrate. Also, the converting may comprise exposing the electrodeposited material to a nitrogen-comprising plasma. Chromium nitride and chromium oxynitride are examples of nitrogen-comprising materials. Copper or gold wiring of an integrated circuit are examples of a substrate. The processing temperature during the electrodepositing and the converting may be selected not to exceed 500° C.

In another aspect of the invention, an integrated circuit wiring forming method includes forming an outer portion of patterned integrated circuit wiring over a substrate by a process other than sputter deposition. The method further includes nitridizing the outer portion with a nitrogen-comprising plasma to form a nitride layer on the wiring. The thickness and composition of the nitride layer may be effective to limit diffusion of at least one component of the wiring through the nitride layer.

In yet another aspect, a method of forming a material comprising a metal nitride may include electrodepositing a metal-containing material on a conductive surface. The metal-containing material may be exposed to a nitrogen-comprising environment and at least some of the metal-containing material may be transformed to a metal nitride.

In a still further aspect, a diffusion barrier forming method may include forming a patterned layer of integrated circuit copper or gold wiring over a substrate. The wiring may be exposed to a chromium-ion-comprising environment while applying an electric current to the wiring to deposit chromium on the wiring. The chromium may be converted to a chromium-nitride-comprising diffusion barrier using a nitrogen-comprising plasma.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
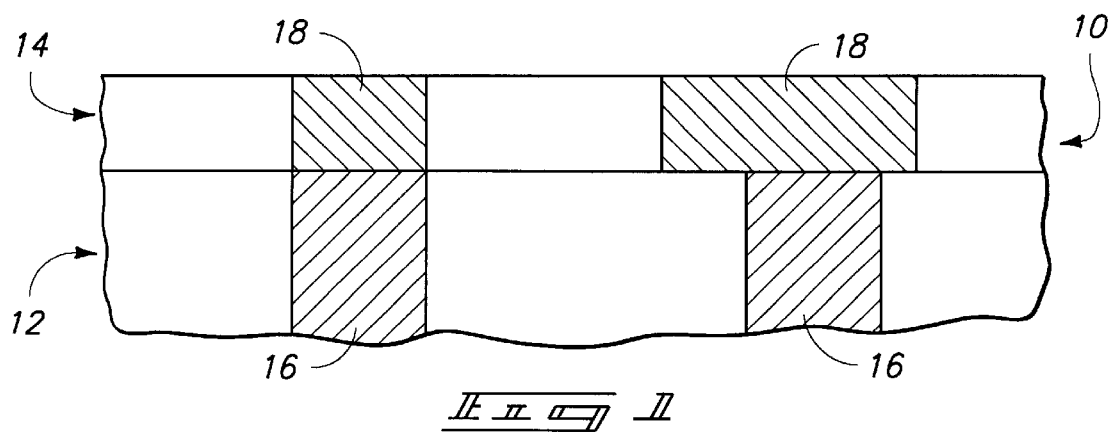
FIG. 1 shows a sectional view of a portion of an integrated circuit device at one step of a method according to the present invention.
Figure 2:
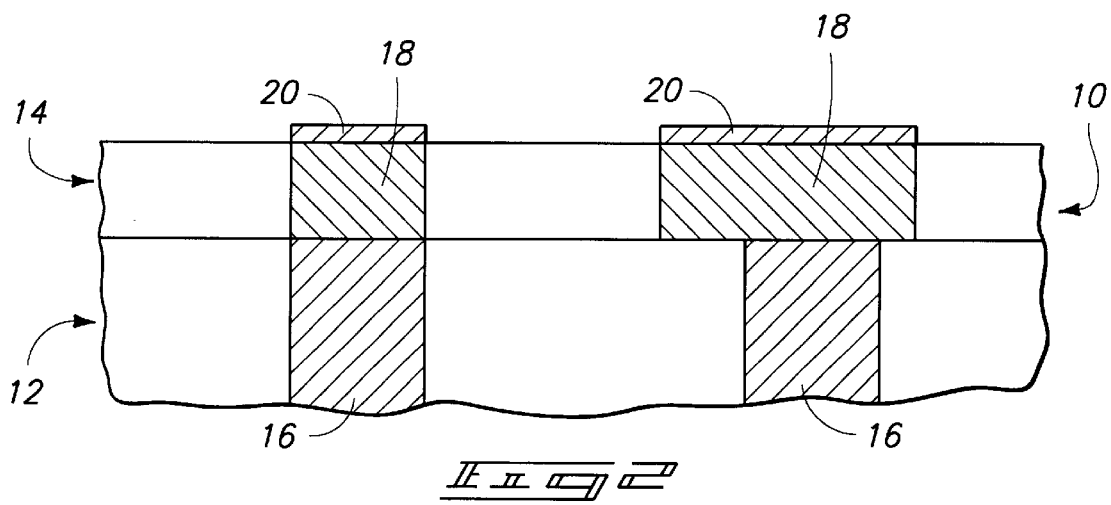
FIG. 2 shows a sectional view of the integrated circuit device of FIG. 1 at a processing step subsequent to that shown in FIG. 1.
Figure 3:
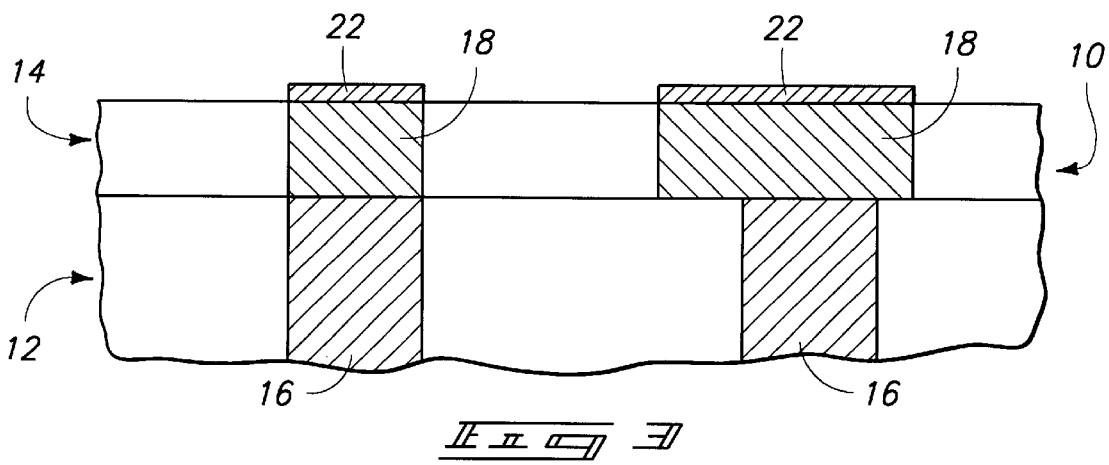
FIG. 3 shows a sectional view of the integrated circuit device of FIG. 1 at a processing step subsequent to that shown in FIG. 2.

The various aspects of the present invention provide a method of forming a nitride layer applicable to a broad range of technology areas. For example, the method may include forming a material comprising a metal nitride. The method may include forming integrated circuit wiring. The method may also include forming diffusion barriers to material underlying or overlying the nitride layer. Forming diffusion barriers to integrated circuit wiring is another example. FIGS. 1–3 show application of one aspect of the invention to integrated circuit wiring. But, as indicated, the invention is applicable to other technologies.

Turning to FIG. 1, an integrated circuit (IC) portion 10 is shown to include an insulation layer 14 formed on an insulation layer 12. Conductive interconnects 16 formed in insulation layer 12 electrically connect to structures (not shown) below insulation layer 12. Wiring 18 electrically connects with conductive interconnects 16 to provide a variety of conductive paths as known to those skilled in the art.

In one aspect of the invention, a nitride layer forming method includes electrodepositing a material on a substrate. "Electrodepositing" is descriptive of a variety of processes and technologies, including electrochemical plating, electroplating, electrochemical deposition, and the like insofar as such processes may be differentiated as known to those skilled in the art. "Electrodeposition" does not include sputter deposition. Using sputter deposition, or sputtering, to form a nitride layer often involves a complex and lengthy process in comparison to the aspects of the invention described herein. In addition to other materials, the electrodeposited material may comprise a metal, such as chromium, and may consist essentially of chromium. One example of electrodepositing is shown in FIG. 2 wherein a metal-containing material 20 is shown formed on wiring 18. Wiring 18 is one example of a substrate on which electrodepositing may occur. Wiring 18 may comprise copper or gold, as well as other materials. Another example of a substrate is a seed layer for subsequent formation of a diffusion barrier, as described below.

Although a metal-containing layer 20 comprising chromium is described in the specific example above, it is to be understood that the invention encompasses embodiments wherein metal-containing layer 20 comprises other metals, consists essentially of other metals, or consists of other metals, such as, for example, titanium or tantalum.

The electrodepositing described previously may occur substantially selectively on a conductive portion of a substrate, and such constitutes one of the advantages over sputter deposition. In FIG. 2, metal-containing material 20 formed substantially selectively over wiring 18 in preference to insulation layer 14. That is, the ratio of the deposition rate over wiring 18 to the deposition rate over insulation layer 14 is at least 100:1, or more preferably at least 1000:1. In this manner, a patterned layer of integrated circuit wiring may receive an electrodeposited material in preference to other surface portions of an integrated circuit device. Accordingly, substantially selective electrodeposition comprises one potential method by which an outer portion, for example, metal-containing material 20, of patterned integrated circuit wiring may be formed over a substrate. Other methods are also conceivable for forming such outer portion as known to those skilled in the art.

One method for forming a material substantially selectively on a conductive substrate includes exposing the substrate to an environment comprising ions desired for forming thereon. The environment may be a gas, liquid, solid, or plasma. For example, such environment may comprise metal ions, such as chromium ions. During the exposing, an electric current is applied to the substrate to deposit the ions thereon. If the substrate is exposed to a chromium-ion-comprising environment, then chromium metal forms on the substrate. One example of such a method is electrodeposition.

Electrodeposition of chromium may be accomplished with a commercially available electroplating tool and a commercially available chromium plating bath. The bath may have a metal content of about 250 gram/liter as chromic acid and about 1 gram/liter as trivalent chromium. Operation of the bath at about 60° C. may be advantageous.

The invention may further include converting at least some of an electrodeposited material to a layer comprising nitrogen and the electrodeposited material. Such converting may include exposing the electrodeposited material to a nitrogen-comprising environment and transforming the electrodeposited material to the nitrogen-comprising layer. The environment may be a gas, liquid, solid, or plasma. The environment may comprise $N_2$, $NH_3$, or other nitrogen-containing substances. Accordingly, the converting may comprise exposing at least some of the electrodeposited material to a nitrogen-comprising plasma. The converting may also comprise implanting a nitrogen-comprising substance into the electrodeposited material, for example, by an ion implant of nitrogen.

In keeping with the various aspects of the invention, if a material is formed by a process comprising other than sputter deposition, then such material may also be converted to comprise nitrogen and at least some of the material. Such a process other than sputter deposition may or may not include electrodeposition.

The converted layer comprising nitrogen may comprise a nitride, for instance, a metal nitride. The nitride may also comprise an oxynitride, including a metal oxynitride. The layer may also consist essentially of chromium nitride and the chromium nitride may consist essentially of chromium oxynitride. Converting a material to a nitride may generally fit with the scope of a broader term "nitridizing," which may include nitride formation by processes other than converting a material to a nitride.

Turning to FIG. 3, a diffusion barrier 22 is shown as formed by converting metal-containing material 20 to a layer comprising nitrogen and at least some of metal-containing material 20. Instead of being formed on wiring 18, metal-containing material 20 may be formed on a conductive seed layer. The seed layer may have a variety of thicknesses, including a thickness similar to integrated circuit wiring. However, the seed layer may also be merely thick enough to allow electrodeposition of metal-containing material 20 thereon. Metal-containing material 20 may then be converted to a diffusion barrier. Integrated circuit wiring may be formed over the diffusion barrier and the seed layer. In this manner, a diffusion barrier according to the various aspects of the invention may formed over or under a material, for example, wiring 18.

Preferably, diffusion barrier 22 comprises a metal nitride. Such metal nitride includes, but is not limited to, metal oxynitride. While a variety of nitridizing methods may exist that are suitable for use with the various aspects of the invention, nitridizing with a nitrogen-comprising plasma is particularly advantageous. A vacuum chamber operated at about 1 to about 10 Torr and capable of generating a plasma may be used. Temperature may be about 200 to about 600° C. The nitrogen-comprising environment within the vacuum chamber may further include hydrogen or methane.

Generally, forming a nitrogen-containing plasma from nitrogen or ammonia gas generates reactive nitrogen atoms that may react at lower temperatures than typically utilized in other nitridizing methods. For some applications, including selected IC devices, forming a nitride layer without exceeding 500° C. can be a significant advantage. Preferably, a processing temperature to which a substrate is exposed does not exceed 500° C. during electrodepositing of a material on the substrate and converting the electrodeposited material to a layer comprising nitrogen in at least some of the electrodeposited material. More preferably, the processing temperature is about 400° C. A processing temperature at or below 500° C. is also preferred in processes comprising other than sputter deposition, which may or may not include electrodeposition.

Forming diffusion barriers may be one particularly advantageous use of the various aspects of the invention. Given the propensity of copper to diffuse into surrounding materials, a diffusion barrier may be warranted in selected circumstances. Chromium is an effective diffusion barrier, as is chromium nitride. Accordingly, the invention is well suited to forming a chromium nitride diffusion barrier. After forming chromium on the copper wiring using one of the various methods described herein, the chromium may be converted to a chromium-nitride-comprising diffusion barrier. Using a nitrogen-comprising plasma represents one technique to accomplish such conversion, especially if a need exists to maintain processing temperature at or below 500° C.

The thickness and composition selected for a diffusion barrier may be effective to inhibit diffusion of at least one component of underlying materials through the diffusion barrier. In addition to being an excellent barrier against copper diffusion, a chromium nitride diffusion barrier may be self-aligned over copper wiring when formed substantially selectively by electrodeposition. Overall, the number and complexity of process steps for forming a nitride layer, a metal nitride, or a chromium-nitride comprising diffusion barrier, as described herein is reduced compared to sputtering processes and other processes. In at least this manner, the various aspects of the invention provide improved nitride layer forming methods applicable to a variety of technology areas.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an integrated circuit comprising:
   electrodepositing chromium onto a substrate; and
   converting at least some of the electrodeposited chromium to a diffusion barrier layer comprising nitrogen and the electrodeposited chromium, said barrier layer being over or under wiring of the integrated circuit.

2. The method of claim 1 wherein the electrodepositing occurs substantially selectively on a conductive portion of the substrate.

3. The method of claim 1 wherein the converting comprises exposing the electrodeposited material to a nitrogen-comprising plasma.

4. The method of claim 1 wherein the converting comprises implanting a nitrogen-comprising substance.

5. The method of claim 1 wherein the barrier layer comprises chromium nitride.

6. The method of claim 1 wherein the barrier layer comprises chromium oxynitride.

7. The method of claim 1 wherein a processing temperature to which the substrate is exposed does not exceed 500° C. during the electrodepositing and the converting.

8. The method of claim 1 wherein the electrodeposited material consists of chromium.

9. The method of claim 1 wherein the electrodeposited material consists essentially of chromium.

10. The method of claim 1 wherein the substrate comprises copper or gold wiring of an integrated circuit.

11. The method of claim 1 wherein the substrate comprises a conductive seed layer.

12. The method of claim 1 wherein the layer comprises a thickness and a composition that are effective to inhibit diffusion of at least one component of the substrate through the layer.

13. The method of claim 1 wherein the barrier layer consists of chromium nitride.

14. The method of claim 1 wherein the barrier layer consists of chromium oxynitride.

15. A method of forming integrated circuit wiring, comprising:
    electrodepositing a chromium-containing material onto a conductive surface; and
    exposing the chromium-containing material to a nitrogen-comprising environment and transforming at least some of the chromium-containing material to a chromium nitride diffusion barrier layer over or under wiring of an integrated circuit.

16. The method of claim 15 wherein the exposing comprises treatment with a nitrogen-comprising plasma.

17. The method of claim 15 wherein the chromium nitride comprises a chromium oxynitride.

18. The method of claim 15 wherein the chromium-containing material consists of chromium.

19. The method of claim 15 wherein the conductive surface comprises copper or gold wiring of an integrated circuit.

20. The method of claim 15 wherein the conductive surface comprises a seed layer for a diffusion barrier.

* * * * *